United States Patent
Vos et al.

(10) Patent No.: US 7,521,408 B2
(45) Date of Patent: Apr. 21, 2009

(54) SEMICONDUCTOR CLEANING SOLUTION

(75) Inventors: Rita Vos, Tremelo (BE); Paul Mertens, Bonheiden (BE); Bernd Kolbesen, Bad Homburg (DE); Albrecht Fester, Frankfurt am Main (DE); Oliver Doll, Heusenstamm (DE)

(73) Assignees: Interuniversitair Microelektronica Centrum ( IMEC), Leuven (BE); Air Products and Chemicals Inc., Allentown, PA (US)

( * ) Notice: Subject to any disclaimer, the term of this patent is extended or adjusted under 35 U.S.C. 154(b) by 686 days.

(21) Appl. No.: 11/301,130

(22) Filed: Dec. 12, 2005

(65) Prior Publication Data

US 2006/0089280 A1    Apr. 27, 2006

Related U.S. Application Data

(63) Continuation of application No. PCT/BE2004/000095, filed on Jun. 26, 2004.

(60) Provisional application No. 60/483,147, filed on Jun. 27, 2003.

(51) Int. Cl.
  *C11D 7/32* (2006.01)
(52) U.S. Cl. ............... 510/175; 510/499; 252/79.1
(58) Field of Classification Search ........... 510/175, 510/499; 252/79.1
See application file for complete search history.

(56) References Cited

U.S. PATENT DOCUMENTS 4,367,072 A * 1/1983 Vogtle et al. ............ 436/501

(Continued)

OTHER PUBLICATIONS

Sun, et al., *Synthesis of Multidentate Ligands Containing Hydroxypryidyl Donor Groups*, Tetrahedron vol. 47, No. 3, pp. 357-364, 1991.

(Continued)

*Primary Examiner*—Gregory E Webb
(74) *Attorney, Agent, or Firm*—Knobbe, Martens Olson & Bear LLP (57) ABSTRACT

The present invention recites a composition comprising a first compound and a second compound. The first compound has the chemical formula ( 1a), wherein m, n and o are independently from each other equal to 2 or 3; wherein p is equal to 1 or 2; R being a chemical group with the chemical formula (1a'), wherein q is equal to 1, 2 or 3; wherein $R_1$, $R_2$ and $R_3$ are independently selected from the group consisting of hydrogen and an organic group. The second compound has the chemical formula (1c). Metal ions can be present in the solution or in an external medium being contacted with the solution. The present invention can be used for cleaning a semiconductor substrate.

22 Claims, 7 Drawing Sheets

U.S. PATENT DOCUMENTS

| | | | |
|---|---|---|---|
| 5,280,746 A | | 1/1994 | Siegel |
| 5,290,361 A | | 3/1994 | Hayashida et al. |
| 5,302,311 A | | 4/1994 | Sugihara et al. |
| 5,421,897 A | * | 6/1995 | Grawe .......................... 134/6 |
| 5,466,389 A | | 11/1995 | Ilardi et al. |
| 5,498,293 A | * | 3/1996 | Ilardi et al. .................... 134/3 |
| 5,686,410 A | * | 11/1997 | Albert et al. .................. 514/12 |
| 5,840,127 A | | 11/1998 | Hayashida et al. |
| 5,885,362 A | * | 3/1999 | Morinaga et al. .............. 134/2 |
| 5,989,353 A | * | 11/1999 | Skee et al. ..................... 134/2 |
| 6,066,609 A | * | 5/2000 | Martin et al. ............... 510/175 |
| 6,228,823 B1 | * | 5/2001 | Morinaga et al. .......... 510/175 |
| 6,498,132 B2 | * | 12/2002 | Morinaga et al. .......... 510/175 |
| 6,599,370 B2 | * | 7/2003 | Skee ............................. 134/3 |
| 6,800,111 B2 | * | 10/2004 | Doubrava et al. ............. 75/426 |
| 7,160,482 B2 | * | 1/2007 | Vos et al. .................... 252/79.1 |
| 7,422,019 B2 | * | 9/2008 | De Waele et al. ............ 134/1.3 |
| 7,432,233 B2 | * | 10/2008 | De Waele et al. .......... 510/175 |
| 2002/0077259 A1 | * | 6/2002 | Skee ......................... 510/175 |
| 2003/0060382 A1 | | 3/2003 | Lee et al. |
| 2004/0254391 A1 | * | 12/2004 | Blacker et al. .............. 558/350 |
| 2005/0009207 A1 | * | 1/2005 | Vos et al. ....................... 438/1 |
| 2005/0159323 A1 | * | 7/2005 | De Waele et al. ........... 510/175 |
| 2006/0025320 A1 | * | 2/2006 | Borner et al. ............... 510/175 |
| 2006/0089280 A1 | * | 4/2006 | Vos et al. .................... 510/175 |
| 2006/0247142 A1 | * | 11/2006 | De Waele et al. ........... 510/175 |
| 2007/0060490 A1 | * | 3/2007 | Skee .......................... 510/175 |
| 2008/0260653 A1 | * | 10/2008 | Buttar et al. .................. 424/45 |

OTHER PUBLICATIONS

Mertens, et al., *Quantitative Modeling of $H_2O_2$ Decomposition in SC1*, Fifth International Symposium on Cleaning Technology in Semiconductor Device Manufacturing, Dec. 8, 1997.

Mertens, et al. *Wafer Cleaning: A Quantifiable Process Step*, Eighth International Symposium on Silicon Materials Science and Technology, Symposium I1. Feb. 9, 1998.

International Search Report for Application No. PCT/BE2004/000095 mailed on Oct. 12, 2004.

* cited by examiner

SEMICONDUCTOR CLEANING SOLUTION

Related Applications

This application is a continuation, under 35 U.S.C. § 120, of International Patent Application No. PCT/BE2004/000095, filed on Jun. 26, 2004 under the Patent Cooperation Treaty (PCT), which was published by the International Bureau in English on Jan. 6, 2005, which designates the U.S. and claims the benefit of U.S. Provisional Application No. 60/483,147, filed Jun. 27, 2003. All above-referenced prior applications are incorporated by reference herein in their entirety and are hereby made a portion of this specification.

FIELD OF THE INVENTION

The present invention relates to a surface treatment composition and a method for treating a surface of a substrate using the same.

BACKGROUND OF THE INVENTION

State of the art

Since the invention of the RCA cleaning by Kern et al. in 1965 (W. Kern and D. A. Pautinen, RCA Review 31, 187, 1970) this cleaning cycle has become the most used for semiconductors. The conventional RCA cleaning consists of two steps: an alkaline solution, the so called SC1 solution and an acidic solution, SC2. The SC1 solution is composed of 1 part ammonia ($NH_4OH$), 1 part hydrogen peroxide ($H_2O_2$) and 5 parts ultra pure water ($H_2O$) and is often referred to as APM-cleaning (i.e. Ammonia Peroxide Mixture). Originally it was used to remove organic residues by oxidation. Later it has been proven to be very efficient to remove particles.

A drawback of the SC1 solution is that metallic contamination such as Fe and Cu are found to catalyze the decomposition reaction of the peroxide (see e.g. Mertens et al., Proc. of the 5$^{th}$ Internat. Symp. on Cleaning Technology in Semiconductor Device Manufacturing PV97-35 (1997)) leading to a decrease in the bath lifetime. Chemical solutions comprising an oxidizing compound have often problems related to the stability of the solution. In pure form, aqueous solutions are stable over extended periods of time. However, the presence of certain metal ions in the solution causes decomposition of the oxidizing compound. Consequently, stabilizers to prevent such decomposition should be added. Stabilizers can be e.g. a complexing compound, such that the complexing compound will bind to the metal and consequently, the metal is not available for reaction with the oxidizing compound. Thus, the decomposition of the oxidizing compound is substantially inhibited and the lifetime of the solution is increased.

Very stringent specifications must be met by oxidizing solutions for specialized applications such as semiconductor applications or reagent chemicals. An overview of stabilizing oxidizing compound, and more specifically hydrogen peroxide solutions, is given in Kirk-Othmer Encyclopedia of Chemical Technology (4$^{th}$ edition), vol 13 pg 965.

Another problem associated with SC1 cleaning solutions is that metals precipitate on silicon surfaces; especially aluminum, iron and zinc have been shown to adsorb strongly on the wafer surface (see e.g. Mertens et al., Proc. of the 8$^{th}$ Internat. Symp. On Silicon Materials Science and Technology PV98-1 (1998)). In order to remove the metallic surface contamination, the SC2 solution consisting of 1 part hydrochloric acid, 1 part hydrogen peroxide and 6 parts ultra-pure water is used. However, it is expensive to get hydrochloric acid of sufficient quality for the usage in SC2 solution. There is also a risk of re-contaminating the surface with particles. Problems also occur in spray tools due the corrosive behavior of hydrochloric acid.

With the progress in semiconductor manufacturing the requirements concerning particle and metal contamination as well as roughness of the silicon surfaces became more stringent. This led to a number of variations of the RCA clean.

The potential problems related to the SC2 and the consideration to reduce process time and equipment by leaving out this acidic step led to the development of single-stage cleaning procedures. This can be done by using chemicals with reduced amount of metallic impurities. For that purpose, advanced purification procedures are established for obtaining ultra-pure water, ammonia and hydrogen peroxide. However, these chemicals are very expensive and the purity is not always assured when they are used in a cleaning bath. Moreover, the cleaning solution is not very robust with respect to metal contamination from the semiconductor substrate and from the hardware.

Besides this, an extra step in the cleaning cycle to remove residual metallic contamination implies extra hardware, e.g. an SC2-tank and a rinse tank need to be used, and more chemicals. Leaving out this extra step will result in a reduction of the hardware cost and a reduction of the amount of chemicals used in the cleaning cycle.

U.S. Pat. No. 5,466,389 describe cleaning solutions containing a complexing agent such as EDTA in combination with a nonionic surfactant. However, these cleaning solutions suffer from the drawback of weak stability of EDTA in peroxide containing cleaning solutions. In addition, in general, nonionic surfactants cannot be rinsed off easily from the wafer surface and traces of organic contamination are left on the wafer surface.

U.S. Pat. No. 5,885,362 describe a method for treating a surface of a substrate with a surface treatment composition. The surface treatment composition comprises a liquid medium containing a complexing agent as a metal deposition preventive. The surface treatment composition is improved by incorporating at least two complexing agents. A first complexing agent is preferably an aromatic hydrocarbon ring with at least an OH or O$^-$ group bonded to a carbon atom constituting the ring. A second complexing agent is compound having a donor atom, in the molecular structure. This invention only focuses on Fe and Al and the combinations of chelating agents disclosed in this invention are not successful in preventing deposition of Zn, which has a high tendency to precipitate from cleaning solutions, which have an intrinsic high pH.

U.S. Pat. No. 5,290,361 and U.S. Pat. No. 5,302,311 describe an aqueous hydrogen peroxide solution further comprising a complexing compound containing phosphonic acid groups and showing complexing ability. Cleaning solutions comprising phosphonic acid groups are not effective because enhanced deposition of Cu has been measured. In addition, there is always a risk of leaving P-contamination on the wafer surface, which makes the cleaning solutions less suitable. U.S. Pat. No. 5,280,746 and U.S. Pat. No. 5,840,127 describe the use complexing agents with hydroxamate functional groups. However, these complexing agents have limited stability in cleaning solutions containing peroxide.

U.S. Pat. No. 6,066,609 describes an aqueous cleaning solution comprising a base, hydrogen peroxide and a complexing agent being a crown ether with side groups able to complex metallic species. However the phosphonic acid side groups described in this patent may also contribute to unwanted P contamination on the wafer surface. In addition, these complexing agents show a limited stability and a lower metal removal performance (see comparative examples).

In the present invention, the problems related to removal of metals as mentioned in the prior art, are avoided.

It is an aim of the invention to provide a stable composition comprising a first compound and a second compound.

It is a further aim of the invention to provide a new composition for treating a substrate, which is stable and provokes less or no metal precipitation on the surface.

Another aim of the invention is to provide a new cleaning solution. Another aim of the present invention is to provide an efficient APM-cleaning solution having a good robustness with respect to metal contamination.

A further aim is to provide a new single-step method for cleaning semiconductor surfaces.

Brief Description of the Drawings

FIG. 1: 1a: chemical structure of the first compound.

SUMMARY OF THE INVENTION

Figure 1A:
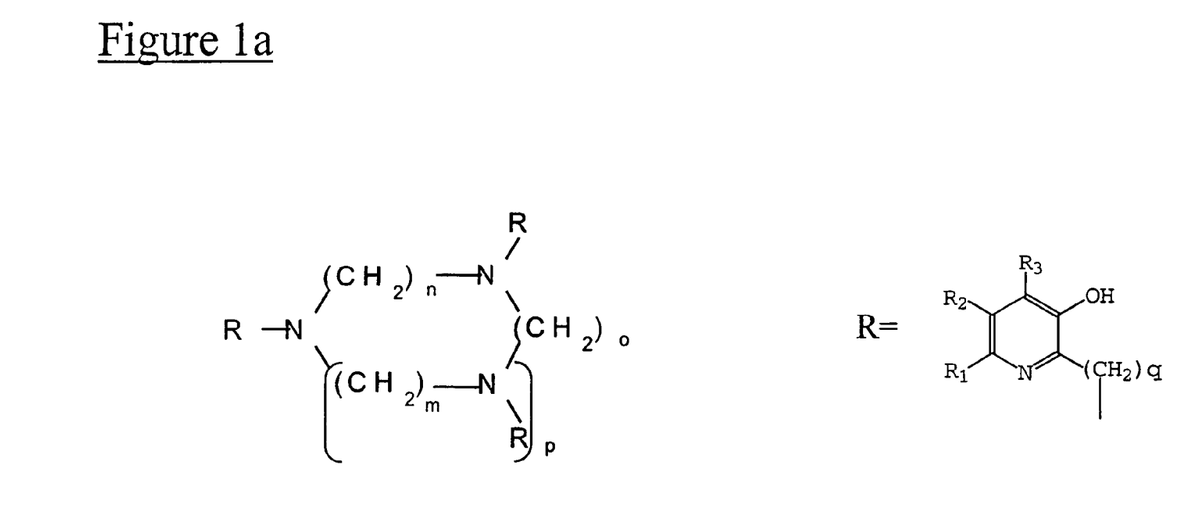

In a first aspect of this invention, a composition is disclosed comprising a first compound and a second compound. The first compound having the chemical formula Wherein m, n and o are independently from each other equal to 2 or 3, (preferably 2)

wherein p is equal to 1 or 2;

R being a chemical group with the formula:

wherein q is equal to 1, 2 or 3, wherein $R_1$, $R_2$ and $R_3$ are independently selected from the group consisting of hydrogen and an organic group, said second compound having a chemical structure that affects the Aluminum solubility.

In a preferred embodiment of this first aspect of this invention, said second compound has the chemical formula In an embodiment, said composition can be in the form of an aqueous solution. The first and the second compound are for complexing metal ions. Metal ions can be present in the solution or in an external medium being contacted by the solution. Metal ions can be understood as chemical compounds comprising at least the metal, preferably the oxidized form.

In an embodiment of this first aspect, said composition as recited in the first aspect of this invention can further comprise an alkaline compound. In a particular embodiment of this first aspect, a composition as recited in the first embodiment of the first aspect of the invention is disclosed wherein alkaline compound comprises an inorganic or organic basic compound. Said alkaline compound can be ammonia or an organic amine, preferably an organic amine chosen from the group consisting of tetraalkylammoniumhydroxide, alkanolamine, choline (hydroxyltrialkylammoniumhydroxide) and guanidine compounds. In an embodiment of this invention, the amount of the alkaline compound lies between 0.0001 to 30 weight %, preferably between 0.01 to 10 weight %.

In an embodiment of this first aspect, said composition as recited in the first aspect of this invention can further comprise an oxidizing compound. In a particular embodiment, said oxidizing compound is hydrogen peroxide. Hydrogen peroxide will be stabilized by the addition of the complexing compound, such that decomposition is substantially inhibited. In an embodiment, the amount of oxidizing compound is between 0.0001 to 30 weight %, preferably between 0.01 to 10 weight %.

In a further embodiment of the first aspect of this invention, a composition as recited in the first aspect of this invention is disclosed wherein said organic group comprises an aliphatic side chain, a heterocyclic side chain or an aromatic side chain.

In an embodiment of the first aspect of this invention, $R_2$ and $R_3$ are hydrogen while $R_1$ is an aliphatic side chain.

Figure 1B:
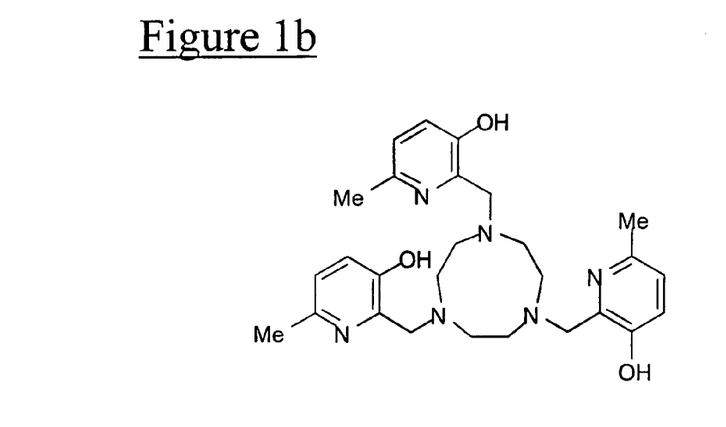
FIG. 1b: chemical structure of the first compound according a preferred embodiment. 1c: chemical structure of the second compound according a preferred embodiment.
Figure 1C:
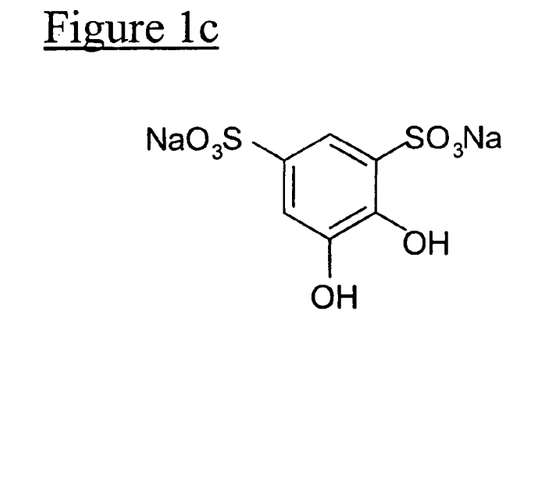

In a particular embodiment, said first compound has the chemical formula as represented in FIG. 1b.

In another embodiment of the first aspect of this invention, a composition is disclosed wherein the amount of said first compound is between 0.001 to 10 weight %, preferably between 0.01 to 1 weight %. In another embodiment of the first aspect of this invention, a composition is disclosed wherein the amount of said second compound is between 0.001 to 10 weight %, preferably between 1 to 10 weight %.

In the preferred embodiment of this invention, a composition for treating a semiconductor surface is disclosed comprising ammonium hydroxide, hydrogen peroxide, water, said first compound and said second compound, wherein said first compound and said second compound are selected from the molecules described in FIG. 1.

In a second aspect of this invention, a method for treating a semiconductor substrate is disclosed. Said semiconductor substrate is treated with a composition comprising a first complexing compound and a second complexing compound. Said composition can have the characteristics as described in the first aspect of this invention.

Said composition can further comprise an oxidizing compound. In a particular embodiment this oxidizing compound can be hydrogen peroxide.

Said composition can be used for treating a substrate, such that particles are oxidized and metallic contamination is removed. The first compound and the second compound are for complexing metallic residues being present on the substrate and in the solution. Additionally, the lifetime of the solution is increased since de decomposition of the oxidizing compound is substantially inhibited. Said solution is particularly suitable for cleaning a semiconductor substrate. Said composition for cleaning a semiconductor substrate can be any composition described in the first aspect of this invention.

In an embodiment of the second aspect of this invention, said composition can further comprise an alkaline compound. Said alkaline compound can comprise an inorganic or organic basic compound. Said basic compound can be chosen from the group consisting of ammonia and organic amine, preferably an organic amine chosen from the group consisting of tetraalkylammoniumhydroxide, alkanolamine, choline (hydroxyltrialkylammoniumhydroxide) and guanidine compounds.

In an embodiment of the second aspect of this invention, the method as recited in second aspect of the invention is disclosed wherein the concentration of the oxidizing compound in the solution lies between 0.0001 to 30 weight %, preferably between 0.001 to 10 weight %.

In an embodiment of the second aspect of this invention, the method as recited in second aspect of the invention is disclosed in which the amount of the first compound is between 0.001 and 10 weight %, preferably between 0.01 to 1 weight %. In another embodiment of the second aspect of this invention, the method as recited in second aspect of the invention is disclosed in which the amount of the second compound is between 0.001 and 10 weight %, preferably between 1 to 10 weight %.

In an embodiment of the second aspect of this invention, the method as recited in second aspect of the invention is disclosed wherein the amount of the alkaline compound lies between 0.0001 to 30 weight %, preferably between 0.01 to 10 weight %.

Detailed Description of the Preferred Embodiment

In relation to the appended drawings the present invention is described in detail in the sequel. It is apparent however that a person skilled in the art can imagine several other equivalent embodiments or other ways of executing the present invention.

In an aspect of this invention, a novel composition is disclosed. Said composition comprises a first compound and a second compound. Said composition can be in the form of an aqueous solution.

Said first compound can have a chemical formula as given in FIG. 1a. The first compound consists of a basic framework derived from the aza-crown-ether wherein m, n and o are independently from each other 2 or 3, p is 1 or 2. R can have the chemical formula as given in FIG. 1b. $R_1$, $R_2$ and $R_3$ are independently selected from the group comprising hydrogen (H) or any organic group. $R_1$, $R_2$ and $R_3$ can have a different chemical structure. q is 1, 2 or 3. For the purpose of this invention, said first compound as described above is generally referred to as pyrinan.

Said organic group can be every possible sequence of C, N, O or S atoms linked to each other by single, double or triple bonds such that the first compound complexes the desired metals. Said organic group can be selected from the group comprising aliphatic side chains, heterocycles and aromatic structures.

Said aliphatic side chain is every possible sequence of carbon atoms linked to each other by a single, double or triple bound and optionally characterized by the presence of functional groups linked to the carbon atoms. Functional groups can be alcohol, carboxyl, carbonyl, aldehyde, keton, ether, ester, amine, amide, halogen containing groups.

Said heterocycle can be one of the group comprising a crown ether, a cryptant, a calixarene, . . . In an embodiment, $R_1$, $R_2$ or $R_3$ are a hydrocarbon. Preferably, $R_1$ is an alkyl chain. $R_1$ can be selected from the group consisting of methyl, ethyl or (iso)propyl or butyl. $R_2$ and $R_3$ are selected from the group consisting of hydrogen, methyl, ethyl or isopropyl. Preferably, $R_1$ and $R_2$ are hydrogen.

$R_3$ is preferably methyl or ethyl.

In a preferred embodiment, the first compound is represented in FIG. 1a. The first compound has a chemical composition such that at least iron, copper and Zinc are complexed. Said second compound has a chemical composition such that at least Aluminum is complexed. Said second compound can also complex copper and iron. The composition comprising the first compound and the second compound can be used to reduce the concentration of the metals on the surface of the substrate or in a solution.

Said second compound is a chemical compound that allows the binding of aluminum. The second compound is an aromatic hydrocarbon comprising at least two OH or $O^-$ group covalently bound to a carbon atom of the ring and at least two $SO_3^-$ group covalently bound to a carbon atom of the ring. Said second compound can be in the acidic form or in the form a Na salt. Preferably, the aromatic hydrocarbon is a benzene group.

In a preferred embodiment, the second compound is represented in FIG. 1c.

Although the addition of the amount of first and the second compound in the composition in this invention is not particularly limited, it is determined by the degree of metal contamination and on the kind of other compounds being present in the solution. Further on, the amount of first and second compound is determined by the specific chemical structure of the complexing compound.

In a preferred embodiment, the ratio (ratio of molar concentration) of the first and the second compound is between 1/1000 and 1/1, between 1/500 and 1/1, between 1/100 and 1/1 and between 1/50 and 1/1. The ratio of the first compound to the second compound can also be between 1000/1 and 1/1, between 500/1 and 1/1, between 100/1 and 1/1 and between 50/1 and 1/1.

The composition can further comprise an oxidizing compound. The oxidizing compound is a chemical compound having oxidizing properties towards organic species, metallic compounds, inorganic particles, silicon, and the like.

The oxidizing compound is a compound selected from the group comprising hydrogen peroxide or oxidizing anions. The oxidizing anions can be e.g. nitric acid and its salts, nitrate, persulfate, periodate, perbromate, perchlorate, iodate, bromate and chlorate salts of ammonium. Preferably, the oxidizing compound is hydrogen peroxide.

The concentration of the oxidizing compound can be, but is not limited hereto, between 0.0001 and 99 weight %, between 0.0001 and 90 weight %, between 0.0001 and 30 weight % and preferably between 0.01 and 10 weight %. In this application, weight % should be understood as the percentage of weight of the specified compound in the composition.

The composition can further comprise an alkaline compound. The alkaline compound or base can be every chemical compound with a pH higher than 7. The alkaline compound can be an organic or inorganic compound. The alkaline compound can be an organic base, ammonia, ammonium hydroxide, or an alkaline solution containing metal ions such as potassium or sodium. Said organic base can be a quaternary ammonium hydroxide such as tetra-alkyl ammonium hydroxide in which the alkyl groups can contain hydroxy- and alkoxy-containing groups with 1 to 4 carbon atoms in the alkyl or alkoxy group. Said organic base can further be an organic amine such as an alkanol amine. Alkanol amines can be 2-aminoethanol, 1-amino 2-propanol, 1-amino 3-propanol. Preferably, the alkaline compounds are tetramethyl ammonium hydroxide, and trimethyl 2-hydroxy ethyl ammonium hydroxide (choline) and ammonium hydroxide.

The amount of the alkaline compound lies between 0.0001 and 90 weight %, between 0.0001 and 50 weight %, between 0.0001 and 30 weight % and preferably between 0.01 and 10 weight %. Said composition can further comprise a surfactant.

In a second aspect of this invention, a method for treating a semiconductor substrate is disclosed. Said semiconductor substrate is treated with a composition comprising a first compound and a second compound.

Said composition can be, but is not limited hereto, the composition described in the first aspect of this invention. Said composition is particularly useful for cleaning a substrate such that particles are oxidized and metallic contamination is removed. The first and the second compound are for complexing metals being present on the surface of the substrate and in the solution. Additionally, the lifetime of the solution is increased since de decomposition of the oxidizing compound is substantially inhibited.

A substrate can be, but is not limited hereto, a substrate such as semiconducting material, glass, quartz, ceramics, metal, plastic, magnetic material, superconductor and the like.

Preferably, said substrate is a semiconductor substrate. Semiconductor substrate can be every possible substrate used in semiconductor processing. Said semiconductor substrate can be a substrate selected from the group, but not limited hereto, comprising a substrate made of silicon, germanium, gallium arsenide, indium phosphide, . . . .

The semiconductor substrate be e.g. the substrates as mentioned above covered entirely op partially with a thin film of e.g. an oxide, a nitride, a metal, a polymeric insulating layer, an anti-reflecting coating, a barrier, a photoresist layer . . . .

The present invention is particularly relevant for cleaning or etching a semiconductor substrate of which the surface should be highly clean.

When the composition is used for treating a substrate, the weight concentration range of the alkaline compound in the cleaning solution is typically but not limited to 0.001-100%, 0.1-20% and preferably 0.1-5% by weight.

For ammonium hydroxide, the weight concentration range of the alkaline compound in the cleaning solution is typically but not limited to 0.001-30%, 0.1-20% and preferably 0.1-5% by weight. For other alkaline compounds, the weight concentration range is equivalent, and function of the strength of the alkaline compound.

When the composition is used for treating a substrate, the weight concentration range of the oxidizing compound in the cleaning solution is typically but not limited to 0.001-100%, 0.1-20% and preferably 0.1-5% by weight.

For hydrogen peroxide, the weight concentration of the oxidizing compound is typically but not limited to 0.001-30%, 0.1-20% and preferably 0.1-5% by weight.

In the preferred embodiment of this invention, a composition for treating a semiconductor surface comprises ammonium hydroxide, hydrogen peroxide, water (hereafter called APM mixtures) and additionally a first and a second complexing compound. Said first complexing compound and said second complexing compound are selected from the molecules described in FIGS. 1b and 1c.

APM-cleaning mixtures comprising a complexing agent according to the present invention are robust with respect to metal contamination coming from the fresh chemicals as well as with respect to metal contamination introduced in the course of its use for cleaning. The robustness of the basic APM process can be improved by the addition of complexing agents that keep the metals in solution and prevent the above-mentioned catalysis of the peroxide decomposition.

The volume mixing ratio of $NH_4OH(29\%)/H_2O_2(30\%)/H_2O$ is typically, but not limited hereto, 0.25/1/5.

The cleaning solution is prepared with the amounts as described above and afterwards the semiconductor substrate is treated with the cleaning solution.

In the best mode known to the applicant, the molecule as described in FIG. 1b and the molecule called tiron is selected and added in the amounts described above. The complexing agent can be added as the pure compound to the cleaning solution. Alternatively, the complexing agent can be dissolved in either water, ammonia or peroxide or a dilution of the two latter chemicals and added as such to the cleaning solution.

It is a further aim of the invention to disclose a process for treating a semiconductor substrate comprising the steps of
    treating said semiconductor substrate with the cleaning solution as described above and
    drying said semiconductor substrate.

An optional step:
    rinsing said semiconductor substrate can be performed after said treating said semiconductor substrate with the cleaning solution as described above. In the step of treating said semiconductor substrate with said cleaning solution, the semiconductor substrate can be immersed in a bath containing the cleaning solution. Alternatively, the cleaning solution can be dispensed or sprayed onto the semiconductor substrate for instance by using a spray processor. In all cases, the cleaning performance of the solution can be enhanced by using a megasonic transducer.

The temperature range for treating the semiconductor substrate with the cleaning solution is typically but not limited to 0-95 degrees Celcius, 10-80 degrees Celcius and preferably between 20-70 degrees Celcius.

The composition is stable in this temperature range. This is an advantage compared to prior art solutions, where the metal-complexing compound complex becomes unstable due to an increase in temperature.

In the step of drying the semiconductor substrate, several techniques known in the art can be used, e.g. spin-drying, Marangoni-drying, drying techniques using organic vapours.

The step of rinsing the semiconductor substrate comprises treating the semiconductor substrate with DI water or treating the semiconductor substrate with a diluted acidic solution or with DI water containing both complexing compounds wherein the total amount is 1 to 100000 ppm, 10 to 10000 ppm and by preference 100 to 1000 ppm.

It is a further aim of the invention to describe a process for treating a semiconductor substrate comprising the step of:

treating said semiconductor substrate with any cleaning solution and/or treating said semiconductor substrate with any rinsing solution Said any cleaning solution can be any cleaning solution, not being limited to the compositions described in this application. Said rinsing solution comprises said first compound and said second compound, as described in the first aspect of this invention. The amount of the complexing agent in the composition can be between $10^{-4}$ and 10 weight %, between $10^{-3}$ and 1 weight %.

This rinsing solution can also comprise a surfactant in an amount of 0.1 w % to 10 w %.

A surfactant is a surface-active agent comprising a lyophobic group and a lyophilic group. The lyophobic group can be a straight-chain alkyl group or a branched-chain alkyl group (C8-C20), an long-chain (C8-C20) alkyl benzene residue, an alkylnaphtalene residue (C3 and greater-length alkyl groups), high-molecular-weight propylene oxide polymers (polyoxypropylene glycol derivatives), long-chain perfluoroalkyl or polysiloxane groups.

Depending upon the lyophilic group, the surfactant can be an anionic, cationic, nonionic or zwitterionic surfactant. Anionic surfactants can be carboxylic acids or carboxylic acid salts (such as sodium and potassium salts of straight-chain fatty acids), sulfonic acids or sulfonic acid salts (such as linear alkylbenzenesulfonates, higher alkylbenzenesulfonates, benzene-, toluene-, xylene- and cumenesulfonates, ligninsulfonates, petroleum sulfonates, N-acyl-n-alkyltaureates, paraffin sulfonates, secondary n-alkanesulfonates, α-olefin sulfonates, sulfosuccinate esters, alkylnaphtalenesulfonates or isethionates), sulfuric acid ester salts (such as sulfated linear primary alcohols, sulfated polyoxyethylenated straight-chain alcohols or sulfated triglyceride oils), phosphoric and polyphosphoric acid esters. Cationic surfactants can be primary amines and their salts, diamines and polyamines and their salts, quaternary ammonium salts (such as tetralkylammonium salts or imidazolinium salts), polyoxyethylenated long-chain amines (RN$(CH_2CH_2O)_xH]_2$), quaternized polyoxyethylenated long-chain amines or amine oxides (such as N-alkyldimethylamine oxides). Nonionic surfactants can be polyoxyethylenated alkylphenols, polyoxyethylenated straight-chain alcohols, polyoxyethylenated polyoxypropylene glycols, polyoxyethylenated mercaptans, long-chain carboxylic acid esters (such as glyceryl and polyglyceryl esters of natural fatty acids, propylene glycol, sorbitol or polyoxyethylenated sorbitol esters, polyoxyethylene glycol esters and polyoxyethylenated fatty acids), alkanolamides, tertiary acetylenic glycols, polyoxyethylenated silicones, N-alkylpyrrolidones or alkylpolyglycosides. Zwitterionic surfactants have both anionic and cationic charges present in the lyophilic portion (such as β-N-alkylaminopropionic acids, N-alkyl-β-iminodipropionic acids, imidazoline carboxylates, N-alkylbetaines, amine oxides, sulfobetaines or sultaines) (M. J. Rosen, Surfactants and Interfacial phenomena, $2^{nd}$ Edition, John Wiley and Sons, New York, 1989])

No additional alkaline compound should need to be added to the said rinsing solution. The pH range of said rinsing solution can typically be, but not limited to, between 5 and 8. Said Rinse solution can be dispensed or sprayed onto the semiconductor surface as described above. During rinsing the performance can also be enhanced by using a megasonic transducer.

The process of treating a semiconductor substrate with a cleaning solution comprising the above mentioned steps can be performed for a certain number of semiconductor substrates. After treating at least one substrate, but preferably after treating more substrates, the composition of the cleaning solution can be modified by e.g. adding extra alkaline compound, adding extra complexing compound, adding oxidizing compound such that the initial composition of the cleaning solution is kept constant as function of the process time.

COMPARATIVE EXAMPLES

The present invention will be further described using non-limiting examples and drawings.

The effectiveness of the new class of complexing agents on the inhibition of the metal catalyzed decomposition of peroxide, the prevention of metal outplating on silicon wafers in metal contaminated APM cleaning solutions and the removal of metallic contamination from silicon wafer surfaces using APM cleaning solutions using is described. A comparison is made with other types of complexing agents containing as functional groups either phosphonic acids, such as diethylene triamine penta-methylenephosphonic acid (DTPMP) and cyclo-triaminotriethylene-N,N',N"-tris (methylenephosphonic acid) (c-Tramp), carboxylic acids, such as ethylene diamino tetra acetic acid (EDTA), hydroxamates, such as Desferal, and complexing agents containing an aromatic hydrocarbon ring with at least an OH or O⁻ group bonded to a carbon atom constituting the ring such as pyrogallol and chromotropic acid. An overview of the different chemicals used for the experiments is given in Table 1. All experiments were done in a class 1000 clean room environment or better.

TABLE 1

| Chemicals used for preparation of APM baths. | | |
| --- | --- | --- |
| Chemical | Vendor | Grade |
| $H_2O_2$ 30 (w/w)% | Ashland | TB(*) |
| $NH_4OH$ 29 (w/w)% | Ashland | TB(*) |
| EDTA | Fluka | |
| DTPMP | Monsanto | Dequest 2060S |
| c-Tramp | | |
| Tiron | Aldrich | |
| pyrinan | | |
| Desferal | Novartis | |
| Pyrogallol | Riedel-de-Haën | Extra pure |
| Chromotropic acid | Fluka | Puriss p.a. |
| DMHP | Aldrich | |

(*)TB-grade corresponds with a specification of maximal 100 ppt of metal ions in the chemical.

Example 1

Metal Outplating from APM Mixtures in Presence of Different Complexing Agents The efficiency of complexing agents to suppress the deposition of metallic contamination onto wafer surfaces was studied. This was done through intentionally spiking controlled trace amounts of metallic contamination to cleaning solutions. For these metal deposition tests, p-type monitor wafers with a diameter of 150 mm and <100> orientation were used. The wafers were pre-cleaned using IMEC Clean® in an automated Steag wet bench (i.e. SOM+dHF+$O_3$-rinse rendering a perfectly clean hydrophilic surface).

The metal deposition experiments were performed in a static quartz tank with a quartz cover plate. This tank was not equipped with a megasonic transducer. APM mixtures were prepared containing 1 w-ppb of different metals of interest with/without the complexing agent added. The metals spiked to the APM bath were added from AAS-standard solutions (Merck). After a bath age of 5 minutes, three wafers were immersed for 10 minutes, rinsed for 10 minutes in an overflow rinse tank and dried with a commercially available Marangoni drier (STEAG). The resulting metal contamination was measured with straight TXRF or VPD-DSE-DC- TXRF (Vapor Phase Decomposition—Droplet Surface Etching—Droplet Collection Total X-Ray Fluorescence). Determination of Al wafer surface concentration was done using VPD-DC GF-AAS (Graphite Furnace Atomic Absorption Spectroscopy).

In Table 2, an overview of the metal deposition from intentionally metal contaminated APM cleaning mixtures and the effect of different complexing agents upon preventing the metal deposition is summarized. It is shown that Pyrinan is very effective to prevent deposition of Fe, Cu and Zn. Tiron on the other hand is very effective to keep the Al in solution and prevent deposition on the wafer surface. Also Fe and Cu can be efficiently complexed. The combined use of pyrinan and tiron results in low surface concentrations for all metals.

The performance of pyrinan and tiron is also compared with other complexing agents. In first instance, different complexing agents for Al that are described in literature to be efficient complexants for Al are compared. Pyrogallol, chromotropic acid and DMHP which are supposed to have the same ability to complex Al as Tiron (see stability constants summarized in Table 3), show a much lower efficiency to complex Al in the APM cleaning solution.

It is shown that the commonly known complexant EDTA is not able to keep the Al in solution and has also no effect on prevention the outplating of Zn. The complexing agent c-Tramp which has a similar ring-structure as pyrinan but different side groups, shows a comparable effectiveness in preventing metal deposition from a contaminated bath as compared to pyrinan. However, in comparative example 2, it will be shown that the c-tramp has a much smaller capability to remove metallic contamination from the wafer surface as compared to pyrinan.

Figure 2:
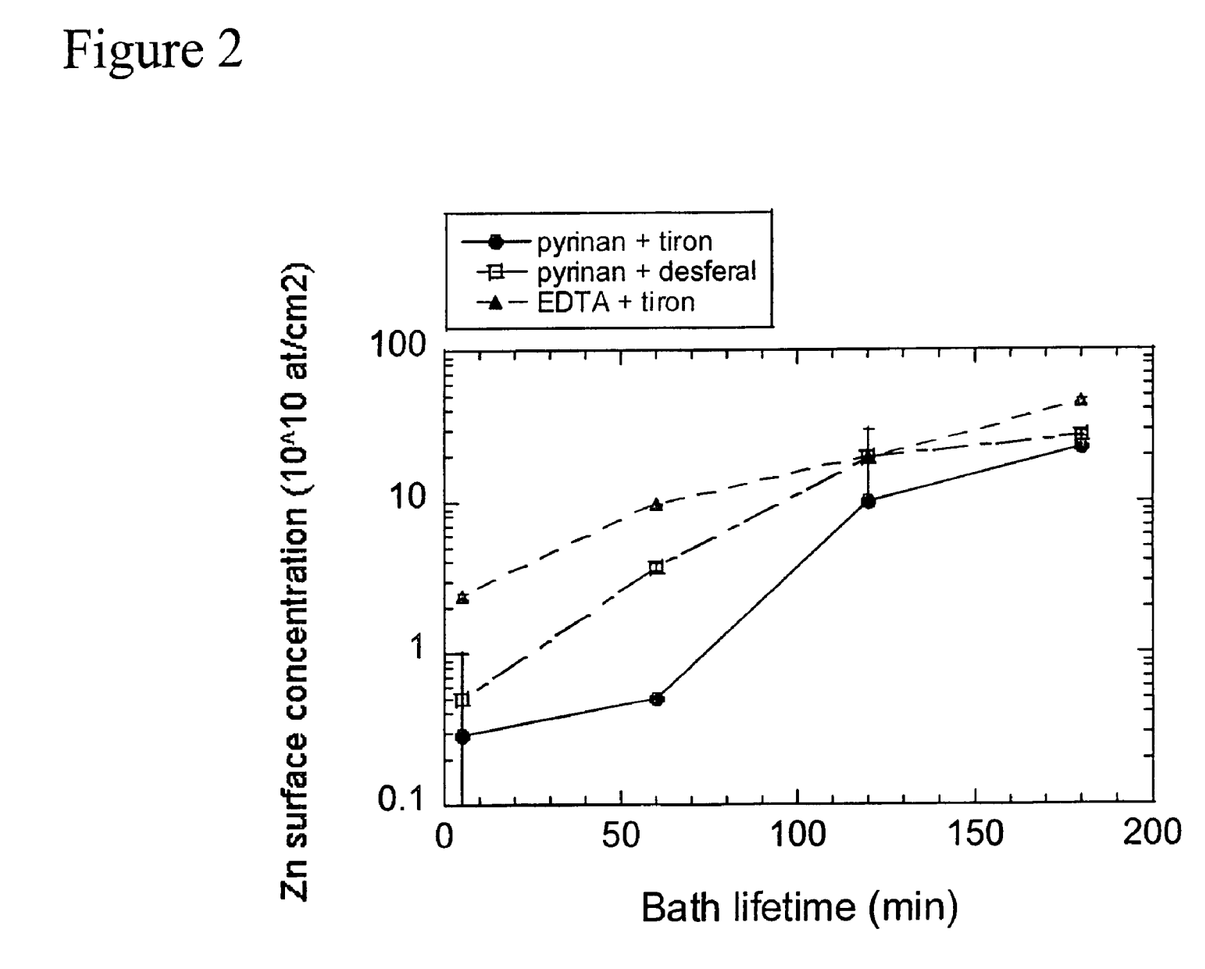
FIG. 2: bath lifetime (minutes) as function of the Zn surface concentration for different compositions.
Figure 3:
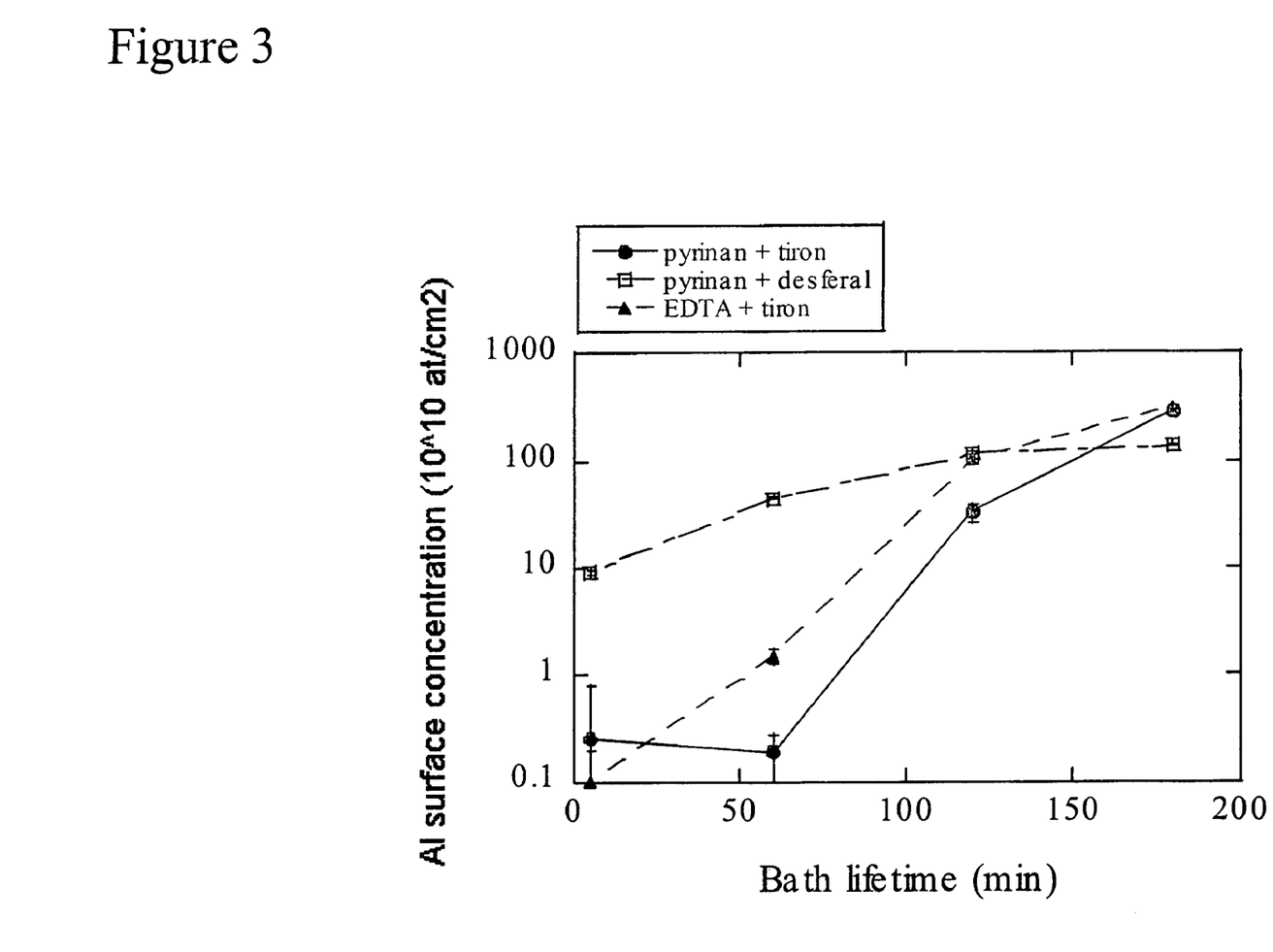
FIG. 3: bath lifetime (minutes) as function of the Al surface concentration for different compositions.

In FIGS. 2 and 3, the efficiency of 'pyrinan+tiron' to prevent metal outplating in APM mixtures is examined by investigating the lifetime of the complexing agents in the APM cleaning bath. A comparison is made with 'EDTA+tiron' and 'pyrinan+desferal'. Desferal it is known to be able to complex Al contamination in APM cleaning baths.

These graphs show that 'pyrinan+tiron' combination has the best performance concerning preventing Zn and Al deposition on the wafer surface as a function of the bath lifetime.

TABLE 3

Overview of bindings constants of different compounds for Al.(*)

|  | K1 | B2 | K3 |
|---|---|---|---|
| Tiron | 19.02 | 31.1 | 2.4 |
| Desferal | 24.5 | — | — |
| Pyrogallol | 24.50 | 44.55 | 13.40 |
| Chromotropic acid | 17.16 | 30.41 | — |
| DMHP | 12.20 | 23.25 | 9.37 |

(*)Stability constants extracted from the SCQUERY database (1993, IUPAC and Academic Software) - SCQUERY version 1.37

Example 2

Removal of Metallic Contamination from Silicon Wafer Surfaces using APM Cleaning Solutions with Different Metal Complexing Agents The final metal surface concentration after cleaning intentionally metal contaminated wafers using a 0.25/1/5 APM clean without any complexing agent at 70 C is summarized in FIG. 3.

For Ca, a rather strong effect of the cleaning time is observed: a 1 min APM removes only 90% of the Ca contamination while a 10 min. clean removes Ca to around $2 \times 10^{10}$ at/cm$^2$. Note that this is also the final Ca surface concentration measured on blank wafers processed. This indicates that the remaining Ca concentration is due to Ca (re)deposition presumably not during cleaning but during the final rinse step.

In absence of complexing agents, an APM clean at 70 C can easily remove Cr, Ni and Cu below $0.5 \times 10^{10}$ at/cm$^2$ even when 1 min. cleaning time is used. The Fe and Zn contamination levels are reduced by one order of magnitude, i.e. from $\pm 10^{12}$ down to $10^{11}$ at/cm$^2$. Using 1 or 10 min cleaning time does not make a lot of difference: probably the low removal for these two elements is not due to kinetic constraints but

TABLE 2

Metal surface concentration ($10^{10}$ at/cm$^2$) after 10 min dip in 0.25/1/5 APM at 50° C. spiked with 1 w-ppb metals and different complexing agents followed by 10 min. OFR and MgDry.

| CA | Conc (M) | Fe | Zn | Al |
|---|---|---|---|---|
| None | — | 108 ± 14 | 18 ± 2 | 300 ± 15 |
| Pyrinan | $2.7 \times 10^{-5}$ | 0.94 ± 0.03 | 1.35 ± 0.8 | 670 ± 50 |
| Pyrinan | $1.3 \times 10^{-3}$ | 0.43 ± 0.02 | 0.11 ± 0.02 | 160 ± 2 |
| Tiron | $2.7 \times 10^{-5}$ | 0.29 | 0.082 | 339 |
| Tiron | $2.7 \times 10^{-4}$ | 1.53 | 74.91 | 7.4 ± 0.1 |
| Tiron | $1.3 \times 10^{-3}$ | 0.15 ± 0.1 | 8.0 ± 0.2 | 0.7 ± 0.04 |
| Tiron | $1.33 \times 10^{-2}$ | NM | NM | <DL |
| Desferal | $2.7 \times 10^{-5}$ | 1.33 ± 0.18 | 45.6 ± 0.1 | 11.5 ± 0.18 |
| Pyrogallol | $1.3 \times 10^{-3}$ | 80.7 ± 2.4 | 30.8 ± 0.3 | 327 ± 18 |
| Chromotropic acid | $1.3 \times 10^{-3}$ | 95.8 ± 8.8 | 23.8 ± 1.8 | 552 ± 5 |
| DMHP | $2.7 \times 10^{-4}$ | 0.21 | 22.26 | 99.9 ± 1 |
| EDTA (70° C.) | $3.2 \times 10^{-5}$ | NA | NA | 272 ± 16 |
| EDTA (RT) | $3.2 \times 10^{-4}$ | 2.7 | 27.7 | NA |
| c-tramp | $2.7 \times 10^{-5}$ | 0.82 | 0.95 | 366 ± 2.5 |
| Pyrinan + tiron | $2.7 \times 10^{-5}$ $1.3 \times 10^{-3}$ | 0.57 ± 0.01 | 0.47 ± 0.02 | <DL |
| Pyrinan + tiron | $2.7 \times 10^{-5}$ $1.3 \times 10^{-3}$ | 0.25 ± 0.54 | 0.29 ± 0.02 | <DL |
| EDTA + tiron | $2.7 \times 10^{-5}$ $1.3 \times 10^{-3}$ | 0.171 ± 0.027 | 2.48 ± 0.06 | <DL |
| Pyrinan + desferal | $2.7 \times 10^{-5}$ $2.7 \times 10^{-5}$ | 0.221 ± 0.03 | 0.463 ± 0.3 | 9.3 ± 0.3 | caused by the low solubility of Fe and Zn (both tend to precipitate when present as metallic contamination).

Figure 4:
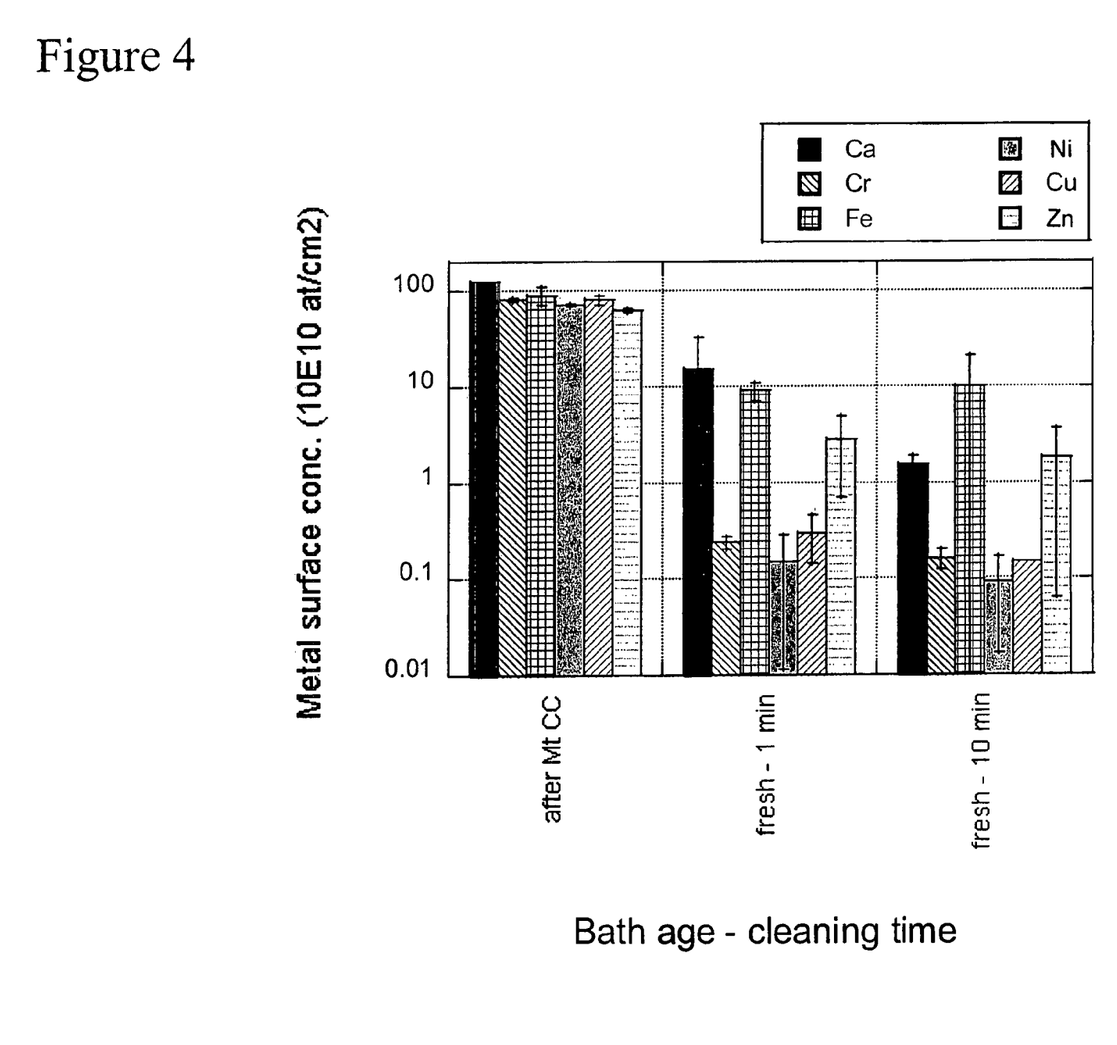
FIG. 4: Metal surface concentration after 0.25/1/5 APM clean at 70 C without complexing agent.

The final metal surface concentration after 0.25/1/5 APM clean at 70 C with respectively c-Tramp (FIG. 5) and pyrinan (FIG. 6) is visualized. It can be concluded that pyrinan can more efficiently clean metals from the wafer surface compared to c-Tramp.

c-Tramp is less efficient to remove Ca and Zn from the wafer surface. More or less similar values are found as for an APM clean without complexing agent (FIG. 4). Pyrinan on the other hand can efficiently remove Ca and Zn also for short cleaning times.

Figure 5:
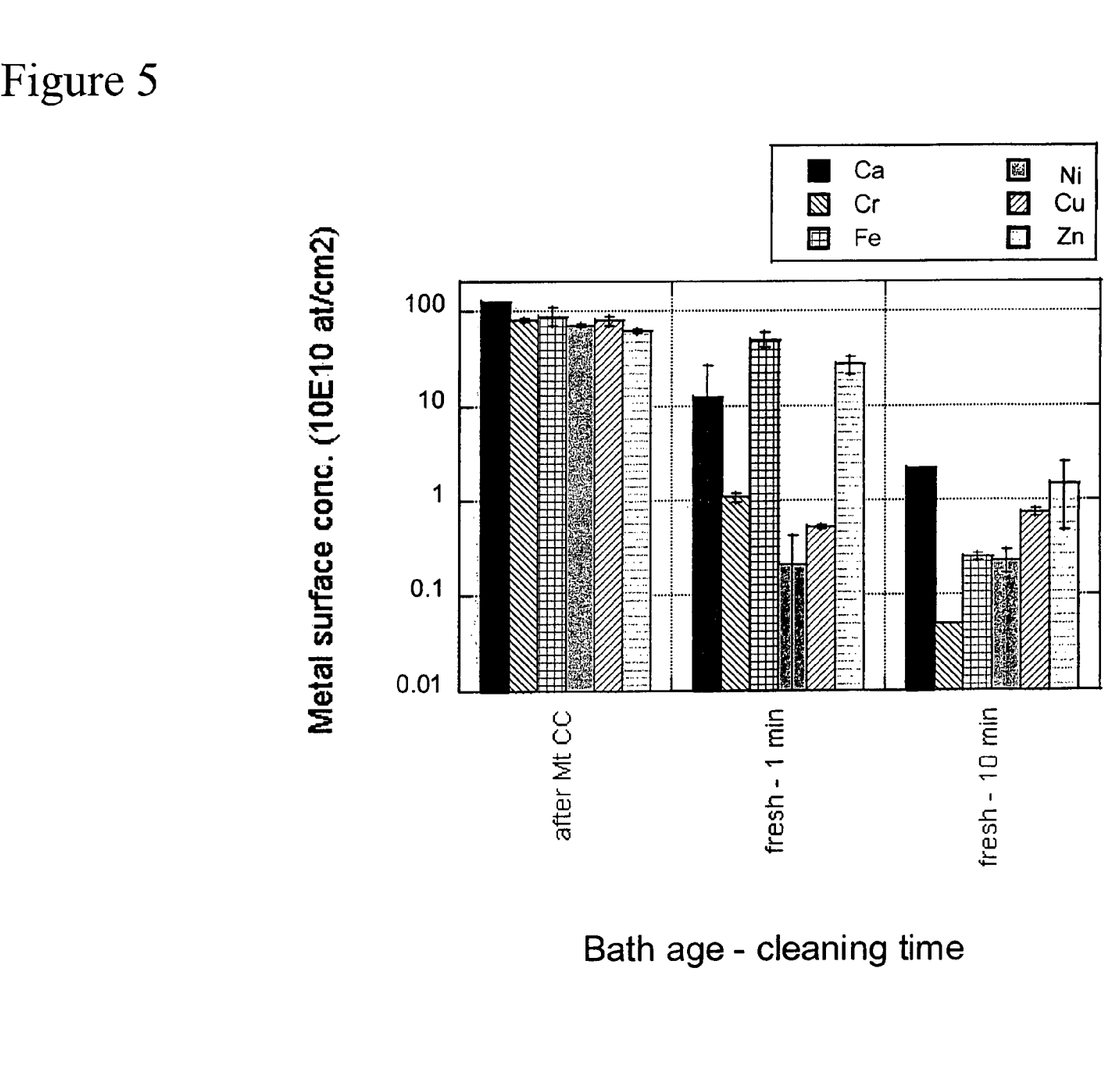
FIG. 5: Metal surface concentration after 0.25/1/5 APM clean at 70 C with c-tramp.
Figure 6:
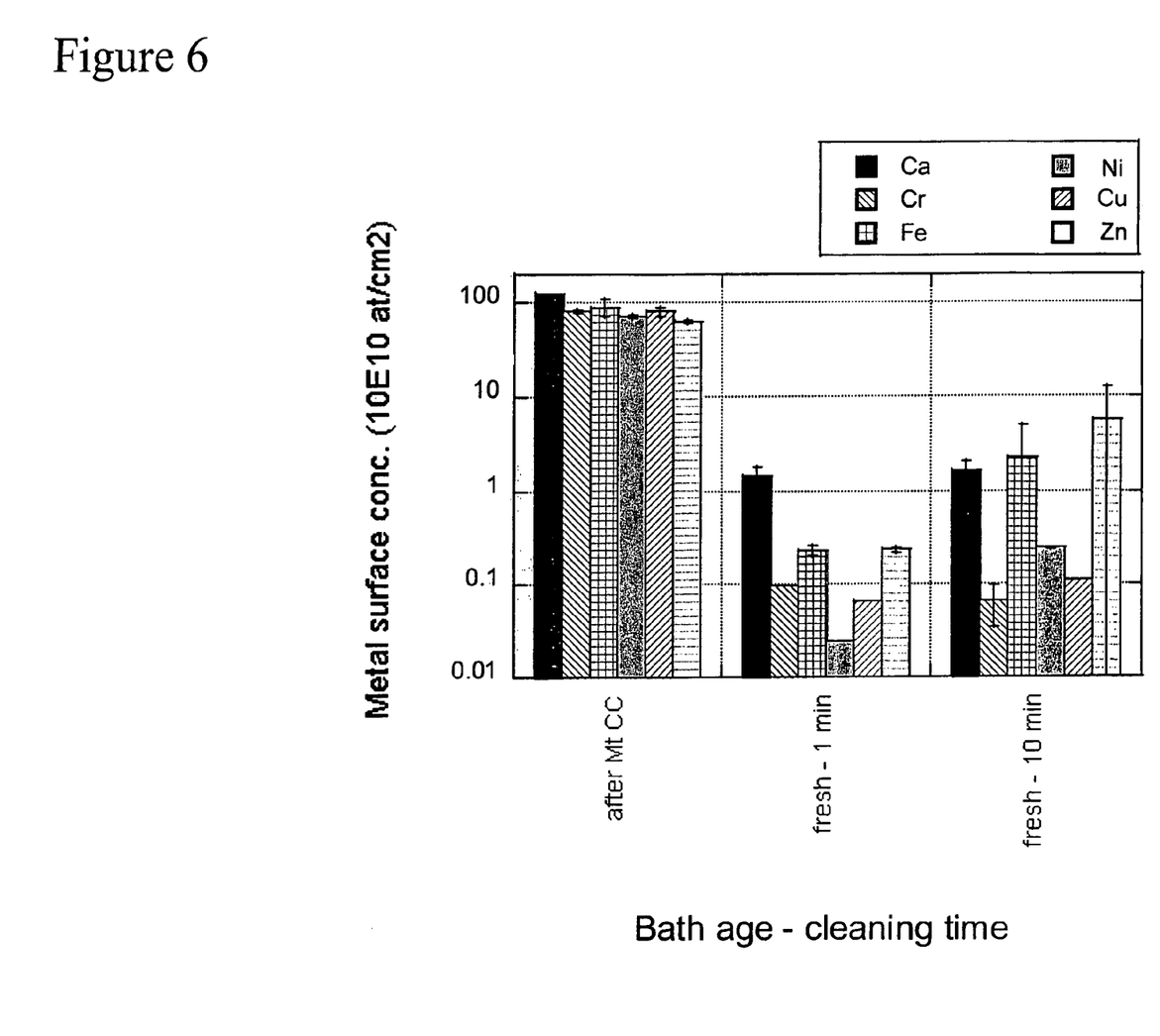
FIG. 6: Metal surface concentration after 0.25/1/5 APM clean at 70 C with puritan.

Ni, Cu and Cr are rather easily removed in all conditions. A 1 minute APM clean with c-Tramp cannot remove Fe contamination while in presence of the pyrinan, Fe can be efficiently removed. Note also that the final Fe contamination level after cleaning with an APM with c-Tramp is higher compared to after a clean with APM only.

Example 3

Figure 7:
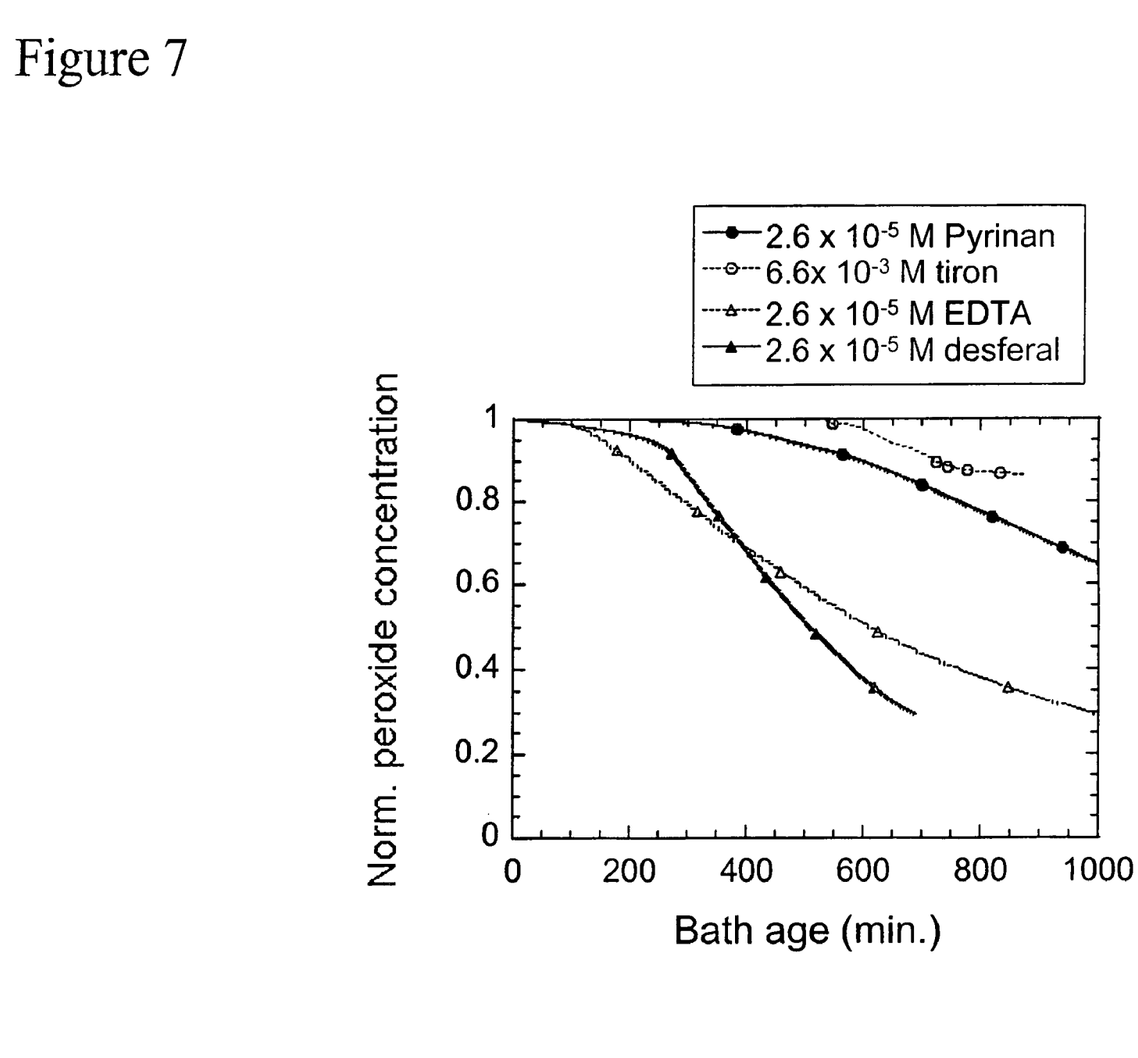
FIG. 7: Decomposition of peroxide in APM cleaning mixtures in presence of trace metal contamination and different metal complexing agents.

Decomposition of Peroxide in APM Cleaning Mixtures in Presence of Trace Metal Contamination and Metal Completing Agents The effect of the addition of a complexing agent to APM cleaning solutions on the kinetics of the decomposition reaction of $H_2O_2$ has been investigated (FIG. 7). Well-controlled amounts of metallic contamination were added to the cleaning mixture under study.

As hydrogen peroxide decomposes, an amount of oxygen gas is liberated following the overall reaction $$2H_2O_2 \leftrightarrows O_2 + 2H_2O$$

The decay of the total peroxide concentration in the APM mixture can be monitored by measuring the time-dependent increase of the pressure due to the $O_2$-evolution in a dedicated set-up as described by Schmidt.

Numerical integration over time yields the actual peroxide concentration in the bath. It is convenient to use peroxide concentrations normalized to its initial value $[H_2O_2]_i$ as $$[H_2O_2]_n = \frac{[H_2O_2]}{[H_2O_2]_i}$$

Since the decomposition reaction is mainly catalyzed by Fe and in a lesser content Cu (Mertens et al. Proc. of the 5th Internat. Symp. on Cleaning Technology in Semiconductor Device Manufacturing PV97-35 (1997), the decay of peroxide concentration in a metal contaminated bath and in presence of a CA, illustrates the ability of complexing primarily Fe in the APM bath.

The decomposition rate as function of bath age is determined in APM mixtures (0.25/1/5 29% $NH_4OH$/30% $H_2O_2$/ $H_2O$) spiked with 1 w-ppb of the metals of interest with and without different complexing agents. The effect of different additives on the inhibition of the metal catalyzed decomposition reaction of peroxide in APM cleaning mixtures is shown in FIG. 7. This graph shows the normalized $H_2O_2$ concentration as function of bath age for an APM mixture at 50° C. spiked with complexing agents pyrinan and tiron. A comparison is also made for two commercially available complexing agents EDTA and desferal. All complexing agents are tested using the same molar concentration in the bath except for tiron which was tested at a 250× higher concentration because tiron does not form 1:1 metal-ligand complexes as the other complexing agents do.

All complexing agents are found to suppress to some extent the decomposition reaction, at least when the mixture is fresh. For EDTA and desferal, the suppression action vanishes much faster over time. This may be attributed to the destruction of the complexing agent or more specifically of the metal-complex in the hot APM. This destruction occurs much faster for these two complexing agents compared to tiron and pyrinan. The lifetime of these two complexing agents amounts to respectively 9 hours and 5 hours. These values correspond to acceptable bath lifetimes.

The invention claimed is:

1. A composition comprising a first compound and a second compound, said first compound having the chemical formula wherein m, n and o are independently from each other equal to 2 or 3,
wherein p is equal to 1 or 2,
wherein R is a chemical group with the formula:

wherein q is equal to 1, 2 or 3,
wherein $R_1$, $R_2$ and $R_3$ are independently selected from the group consisting of hydrogen and an organic group,
wherein said second compound is capable of complexing at least one metal selected from the group consisting of aluminum, iron, and copper and wherein the second compound has the chemical formula 2. The composition of claim 1, wherein said composition is an aqueous composition.

3. The composition of claim 1, further comprising an oxidizing compound.

4. The composition of claim 3, wherein said oxidizing compound is hydrogen peroxide.

5. The composition of claim 3, wherein an amount of said oxidizing compound is from about 0.0001 weight % to about 30 weight %.

6. The composition of claim 3, wherein an amount of said oxidizing compound is from about 0.01 weight % to about 10 weight %.

7. The composition of claim 1, further comprising an alkaline compound.

8. The composition of claim 7, wherein an amount of said alkaline compound is from about 0.0001 weight % to about 30 weight %.

9. The composition of claim 7, wherein an amount of said alkaline compound is from about 0.01 weight % to about 10 weight %.

10. The composition of claim 7, wherein said alkaline compound comprises an inorganic basic compound or an organic basic compound.

11. The composition of claim 7, wherein said alkaline compound is selected from the group consisting of ammonia and an organic amine.

12. The composition of claim 11, wherein said organic amine is selected from the group consisting of choline(hydroxyltrialkylammoniumhydroxide), alkanolamine, tetraalkylammoniumhydroxide, and guanidine compounds.

13. The composition of claim 1, further comprising an oxidizing compound and an alkaline compound.

14. The composition of claim 1, wherein said organic group is selected from the group consisting of an aliphatic side chain, a heterocyclic side chain and an aromatic side chain.

15. The composition of claim 1, wherein $R_2$ and $R_3$ are hydrogen and $R_1$ is an aliphatic side chain.

16. The composition of claim 1, wherein said first compound has the chemical formula 17. The composition of claim 1, wherein m, n, and o are each equal to two.

18. The composition of claim 1, further comprising ammonium hydroxide, hydrogen peroxide, and water.

19. The composition of claim 1, wherein an amount of said first compound is from about 0.001 weight % to about 10 weight %.

20. The composition of claim 1, wherein an amount of said first compound is from about 0.01 weight % to about 1 weight %.

21. The composition of claim 1, wherein an amount of said second compound is from about 0.001 weight % to about 10 weight %.

22. The composition of claim 1, wherein an amount of said second compound is from about 1 weight % to about 10 weight %.

* * * * *

UNITED STATES PATENT AND TRADEMARK OFFICE
CERTIFICATE OF CORRECTION

PATENT NO. : 7,521,408 B2 Page 1 of 1
APPLICATION NO. : 11/301130
DATED : April 21, 2009
INVENTOR(S) : Vos et al.

It is certified that error appears in the above-identified patent and that said Letters Patent is hereby corrected as shown below:

On the Title Pg (Item 56) Col. 1 line 6 under Other Publications, change "Hydroxypryidyl" to --Hydroxypyridyl--.

On the Title Pg (Item 74) (Attorney, Agent, or Firm) line 1-2 change "Knobbe, Martens Olson & Bear LLP" to --Knobbe Martens Olson & Bear LLP--.

Col. 1 line 23 below "BACKGROUND OF THE INVENTION" delete "State of the art".

Col. 9 line 4 after "solution" insert --.--.

Col. 9 line 18 change "alkylnaphtalene" to --alkylnaphthalene--.

Col. 9 line 31 change "alkylnaphtalenesulfonates" to --alkylnaphthalenesulfonates--.

Col. 9 line 54 change "1989])" to --1989).--.

Signed and Sealed this

Twenty-ninth Day of September, 2009

David J. Kappos
*Director of the United States Patent and Trademark Office*